(12) United States Patent
Peng

(10) Patent No.: US 11,004,908 B1
(45) Date of Patent: May 11, 2021

(54) PIXEL STRUCTURE AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Jiuhong Peng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/847,874

(22) Filed: Apr. 14, 2020

(30) Foreign Application Priority Data

Dec. 19, 2019 (CN) .......................... 201911316923.7

(51) Int. Cl.
*G09G 3/30* (2006.01)
*H01L 27/32* (2006.01)
*G09G 3/20* (2006.01)

(52) U.S. Cl.
CPC ....... *H01L 27/3218* (2013.01); *G09G 3/2003* (2013.01); *H01L 27/3216* (2013.01); *G09G 2300/0439* (2013.01); *G09G 2340/0457* (2013.01)

(58) Field of Classification Search
CPC ............ H01L 27/3218; H01L 27/3216; G09G 3/2003; G09G 3/30; G09G 3/32; G09G 3/34; G09G 3/36; G06F 3/041
See application file for complete search history.

(56) References Cited

U.S. PATENT DOCUMENTS

| | | | |
|---|---|---|---|
| 8,446,498 B2 | 5/2013 | Ishiwata | |
| 2012/0176428 A1 | 7/2012 | Credelle | |
| 2014/0071030 A1* | 3/2014 | Lee | H01L 27/3218 345/82 |
| 2016/0027376 A1 | 1/2016 | Chen | |
| 2018/0247984 A1* | 8/2018 | Wang | H01L 27/3216 |
| 2019/0081113 A1 | 3/2019 | Gu et al. | |
| 2019/0228707 A1* | 7/2019 | Park | G09G 3/3233 |
| 2019/0252469 A1* | 8/2019 | Xiao | H01L 27/3216 |
| 2019/0355794 A1* | 11/2019 | Dai | H01L 27/3216 |
| 2020/0075691 A1* | 3/2020 | Zhou | H01L 27/326 |
| 2020/0127060 A1* | 4/2020 | Li | H01L 27/3218 |
| 2020/0194512 A1 | 6/2020 | Wang | |
| 2020/0194520 A1* | 6/2020 | Seo | H01L 27/3216 |
| 2020/0279892 A1 | 9/2020 | Chen et al. | |

(Continued)

FOREIGN PATENT DOCUMENTS

| | | |
|---|---|---|
| CN | 103311266 A | 9/2013 |
| CN | 103715227 A | 4/2014 |

(Continued)

*Primary Examiner* — Pegeman Karimi

(57) ABSTRACT

A pixel structure and a display device are provided. The pixel structure is designed and arranged in this way, which is helpful for simplifying a layout design of data lines. In addition, this can reduce dependence on a compensation circuit in a driving circuit. Further, arrangements and shapes of first sub-pixels and second sub-pixels are same. Therefore, a set of masks can be used to make the first sub-pixels and the second sub-pixels together, thereby reducing the mold charge of the masks and saving costs.

18 Claims, 1 Drawing Sheet

(56) References Cited

U.S. PATENT DOCUMENTS

2020/0321407 A1 10/2020 Tang et al.
2020/0394955 A1 12/2020 Lee

FOREIGN PATENT DOCUMENTS

| | | | |
|---|---|---|---|
| CN | 104885141 | A | 9/2015 |
| CN | 105096885 | A | 11/2015 |
| CN | 106935616 | A | 7/2017 |
| CN | 107452778 | A | 12/2017 |
| CN | 109671759 | A | 4/2019 |
| CN | 109713027 | A | 5/2019 |
| CN | 109994504 | A | 7/2019 |
| CN | 110350004 | A | 10/2019 |
| EP | 1741283 | B1 | 6/2012 |

\* cited by examiner

PIXEL STRUCTURE AND DISPLAY DEVICE

FIELD OF INVENTION

The present disclosure relates to the field of display technologies, and more particularly to a pixel structure and a display device.

BACKGROUND OF INVENTION

Organic light emitting diode (OLED) displays have become mainstream products in the market today. Display panel has a plurality of pixel units arranged in a matrix. Each pixel unit includes a plurality of sub-pixels. For example, each pixel unit includes three sub-pixels such as a red (R) sub-pixel, a green (G) sub-pixel, and a blue (B) sub-pixel. Each pixel unit displays colors through different combinations of the three sub-pixels.

In order to improve visual effect, people have higher and higher requirements for resolution of the display panel. That is, a number of pixels contained in an inch is increasing. This requires that a size of the sub-pixels is getting smaller and smaller, and a distance between the sub-pixels is getting closer. However, due to process limitations of an array substrate and requirements for a luminous lifetime of the device, a sub-pixel size cannot be reduced indefinitely. In order to improve a display performance when a size of the sub-pixels is constant, the prior art proposes an arrangement of common sub-pixels of adjacent pixels to reduce the number of sub-pixels, thereby achieving simulating high resolution with low resolution.

In currently widely used structural designs, whether in a horizontal or vertical direction, the sub-pixels are arranged alternately, which is not conducive to a design of a driving circuit and software rendering.

SUMMARY OF INVENTION

To solve the above issues, embodiments of the present invention provide a pixel structure and a display device, which can effectively solve issues of a current alternate arrangement of sub-pixels, which is not conducive to a design of a driving circuit.

According to an aspect of the present invention, an embodiment of the present invention provides a pixel structure, comprising: honeycomb units configured to divide the pixel structure into a plurality of regions, each of the honeycomb units comprising a first regular quadrilateral; each of the honeycomb units comprising: a first sub-pixel disposed at a vertex of the first regular quadrilateral; a second sub-pixel disposed at a center of the first regular quadrilateral; and a third sub-pixel disposed on a side of a second regular quadrilateral, wherein a vertex of the second regular quadrilateral is positioned at a midpoint of each side of the first regular quadrilateral; wherein rows and columns where the first sub-pixels are located are all the first sub-pixels; wherein rows and columns where the second sub-pixels are located are all the second sub-pixels; and wherein rows and columns where the third sub-pixels are located are all the third sub-pixels.

In an embodiment of the present invention, the first sub-pixels and the second sub-pixels have a same shape.

In an embodiment of the present invention, two third sub-pixels are disposed on each side of the second regular quadrilateral.

In an embodiment of the present invention, each of the third sub-pixel comprises rectangular.

In an embodiment of the present invention, an area of each of the third sub-pixels is less than an area of each of the first sub-pixels.

In an embodiment of the present invention, the first sub-pixels, the second sub-pixels, and the third sub-pixels are red sub-pixels, green sub-pixels, and blue sub-pixels, respectively.

In an embodiment of the present invention, a ratio of a number of the first sub-pixels, the second sub-pixels, and the third sub-pixels in each of the honeycomb units is 1:1:8.

In an embodiment of the present invention, the first sub-pixels and the second sub-pixels are octagonal or circular.

In an embodiment of the present invention, a threshold voltage of a driving thin film transistor included in each of the first sub-pixels of each row or each column and a data signal voltage thereof are same; wherein a threshold voltage of a driving thin film transistor included in each of the second sub-pixels of each row or each column and a data signal voltage thereof are same; and wherein a threshold voltage of a driving thin film transistor included in each of the third sub-pixels of each row or each column and a data signal voltage thereof are same.

According to another aspect of the present invention, an embodiment of the present invention further provides a display device, comprising the pixel structure.

Advantages of the embodiments of the present invention are that the same column of sub-pixels in the pixel structure described in the embodiments of the present invention are arranged in a vertical direction by sub-pixels having the same color in a vertical direction, and the same row of sub-pixels are arranged in a horizontal direction by sub-pixels having the same color. These sub-pixels are arranged in a straight line and within a display panel formed by the pixel structure. The threshold voltage of the driving thin film transistor of each sub-pixel of each row or column is the same as a data signal voltage. This is helpful for simplifying a layout of data lines and reducing dependence on a compensation circuit in a driving circuit. This is helpful to reduce difficulty of designing the driving circuit, simplify a manufacturing process, and save costs. In addition, arrangements and shapes of the first sub-pixel and the second sub-pixel are the same. Therefore, a set of masks can be shared for production, thereby reducing mold charge of the masks and saving costs.

DESCRIPTION OF DRAWINGS

The following detailed description of specific embodiments of the present application will make the technical solutions and other beneficial effects of the present application obvious in conjunction with the accompanying drawings.

Figure 1:
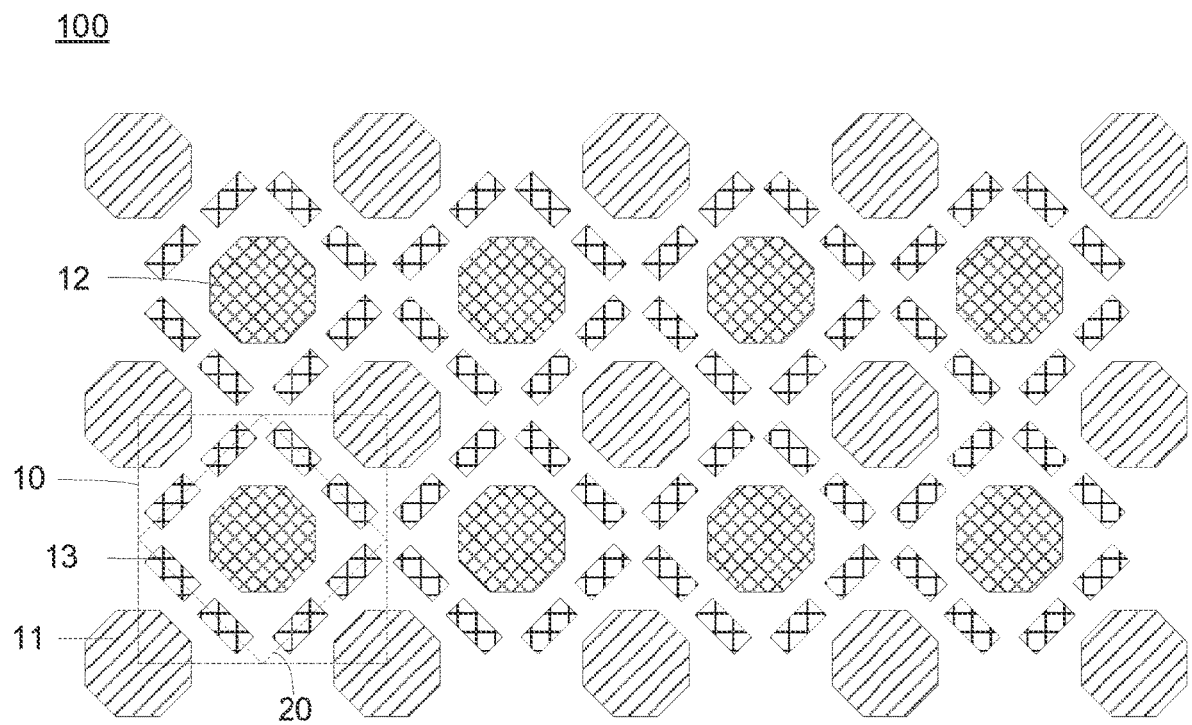
FIG. 1 is a schematic structural diagram of a pixel structure according to an embodiment of the present invention.

The technical solutions in the embodiments of the present invention will be clearly and completely described below with reference to the drawings in the embodiments of the present invention. Obviously, the described embodiments are only a part of the embodiments of the present invention, but not all the embodiments. Based on the embodiments of the present invention, all other embodiments obtained by those skilled in the art without creative efforts fall into the protection scope of the present invention.

In the description of the present invention, it is understood that the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc. indicate an orientation or positional relationship based on an orientation or positional relationship shown in the drawings. This is only for the convenience of describing the present invention and simplifying the description and does not indicate or imply that the device or element referred to must have a particular orientation and must be constructed and operate in a particular orientation. Therefore, it cannot be understood as a limitation to the present invention.

In addition, the terms "first" and "second" are used for descriptive purposes only and should not be interpreted as indicating or implying relative importance or implicitly indicating the number of technical features indicated. The features thus defined as "first" and "second" may explicitly or implicitly include one or more of said features. In the description of the present invention, the meaning of "plurality" is two or more, unless specifically defined otherwise.

Referring to FIG. 1, which is a schematic diagram of a pixel structure according to an embodiment of the present invention. The pixel structure includes: honeycomb units configured to divide the pixel structure into a plurality of regions, each of the honeycomb units comprise a first regular quadrilateral 10.

Each of the honeycomb units 10 comprise: a first sub-pixel 11, a second sub-pixel 12, and a third sub-pixel 13.

The first sub-pixel 11 is disposed at a vertex of the first regular quadrilateral 10. Preferably, a center of the first sub-pixel 11 is disposed at the vertex of the first regular quadrilateral 10. The second sub-pixel 12 is disposed at a center of the first regular quadrilateral 10. Preferably, the center of the second sub-pixel 12 is disposed at the center of the first regular quadrilateral 10. The third sub-pixel 13 is disposed on a side of a second regular quadrilateral 20. Preferably, two third sub-pixels 13 are respectively disposed on each side of the second regular quadrilateral 20.

An area of the third sub-pixel 13 is smaller than that of the first sub-pixel 11.

In an embodiment, the shape of the third sub-pixel 13 is rectangular but is not limited thereto. For example, the third sub-pixel 13 may also be circular or pentagonal, and so on.

In an embodiment, a vertex of the second regular quadrilateral 20 is positioned at a midpoint of each side of the first regular quadrilateral 10.

Preferably, the shapes of the first sub-pixel 11 and the second sub-pixel 12 are the same, and the distributions of the first sub-pixel 11 and the second sub-pixel 12 are also the same. Therefore, the first sub-pixel 11 and the second sub-pixel 12 can share a set of masks, thereby reducing the mold charge of the masks and saving costs.

In one embodiment, the first sub-pixel 11 and the second sub-pixel 12 are octagonal but are not limited thereto. For example, in other embodiments, the first sub-pixel 11 and the second sub-pixel 12 are circular.

Rows and columns where the first sub-pixels 11 are located are all the first sub-pixels 11, rows and columns where the second sub-pixels 12 are located are all the second sub-pixels 12, and rows and columns where the third sub-pixels 13 are located are all the third sub-pixels 13.

Therefore, in the display device formed by the pixel structure, a threshold voltage and a data signal voltage of a driving thin film transistor of each of the sub-pixels (first sub-pixel, second sub-pixel, and third sub-pixel) of each row or column are same, such a design is helpful to simplify the arrangement of data lines, and at the same time, it can reduce the dependence on the compensation circuit in the driving circuit, thereby helping to reduce the design difficulty of the driving circuit, simplifying the manufacturing process, and saving costs.

In one embodiment, the first sub-pixel 11, the second sub-pixel 12, and the third sub-pixel 13 are respectively a red sub-pixel, a green sub-pixel, and a blue sub-pixel, but are not limited thereto. For example, the first sub-pixel 11, the second sub-pixel 12, and the third sub-pixel 13 are a green sub-pixel, a red sub-pixel, and a blue sub-pixel, respectively.

A ratio of the number of the first sub-pixel 11, the second sub-pixel 12, and the third sub-pixel 13 in each of the honeycomb units (i.e., pixel units) is 1:1:8. Since the area of the third sub-pixel 13 is the smallest, in order to ensure that light emission brightness of the third sub-pixel 13 is reset, the third sub-pixel 13 is the largest in number.

In addition, the threshold voltage and the data signal voltage of the driving thin film transistor included in each first sub-pixel 11 of each row or column are the same. The threshold voltage and data signal voltage of the driving thin film transistor included in each second sub-pixel 12 of each row or column are the same. The threshold voltage and the data signal voltage of the driving thin film transistor included in each third sub-pixel 13 of each row or column are the same.

Advantages of the embodiments of the present invention are that the same column of sub-pixels in the pixel structure described in the embodiments of the present invention are arranged in a vertical direction by sub-pixels having the same color in a vertical direction, and the same row of sub-pixels are arranged in a horizontal direction by sub-pixels having the same color. These sub-pixels are arranged in a straight line and within a display panel formed by the pixel structure. The threshold voltage of the driving thin film transistor of each sub-pixel of each row or column is the same as a data signal voltage. This is helpful for simplifying a layout of data lines and reducing dependence on a compensation circuit in a driving circuit. This is helpful to reduce difficulty of designing the driving circuit, simplify a manufacturing process, and save costs. In addition, arrangements and shapes of the first sub-pixel and the second sub-pixel are the same. Therefore, a set of masks can be shared for production, thereby reducing mold charge of the masks and saving costs.

Figure 2:
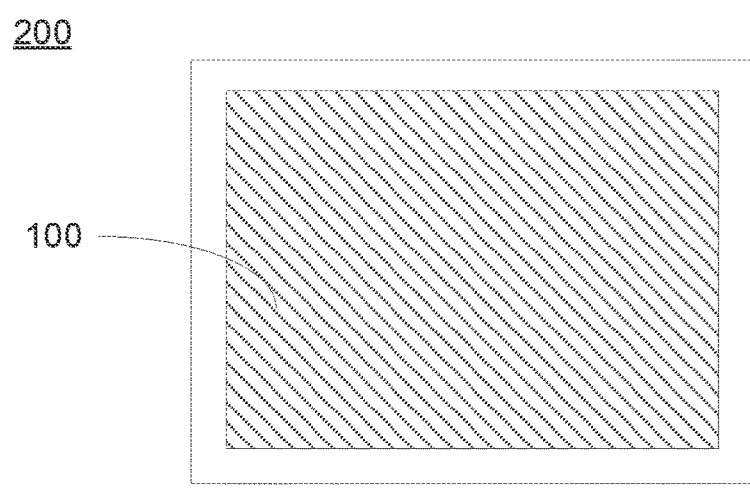
FIG. 2 is a schematic structural diagram of a display device according to an embodiment of the present invention.

Referring to FIG. 2, a display device 200 is also provided in an embodiment of the present invention. The display device 200 includes the pixel structure 100 described in the above embodiments. The display device 200 may be any product or component having a display function, such as a mobile phone, a tablet computer, a television, a display, a notebook computer, a digital photo frame, an electronic paper, a navigator, and the like.

When the display device 200 of this embodiment adopts the pixel structure 100 described in the above embodiment, its display effect is better.

Of course, the display device 200 of this embodiment may further include other conventional structures, such as a power supply unit and a display driving unit.

The above are only preferred embodiments of the present invention and are not intended to limit the present invention. Those skilled in the art can make various modifications and retouching without departing from the spirit and scope of the present invention. Therefore, the protection scope of the present invention is subject to the scope defined by the claims.

What is claimed is:

1. A pixel structure, comprising:
honeycomb units configured to divide the pixel structure into a plurality of regions, each of the honeycomb units comprising a first regular quadrilateral; each of the honeycomb units comprising:
a first sub-pixel disposed at a vertex of the first regular quadrilateral;
a second sub-pixel disposed at a center of the first regular quadrilateral; and
a third sub-pixel disposed on a side of a second regular quadrilateral, wherein a vertex of the second regular quadrilateral is positioned at a midpoint of each side of the first regular quadrilateral;
wherein rows and columns where the first sub-pixels are located are all the first sub-pixels;
wherein rows and columns where the second sub-pixels are located are all the second sub-pixels; and
wherein rows and columns where the third sub-pixels are located are all the third sub-pixels;
wherein a threshold voltage of a driving thin film transistor included in each of the first sub-pixels of each row or each column and a data signal voltage thereof are same, a configuration of the same threshold voltage and data signal voltage of the driving thin film transistor included in each of the first sub-pixels of each row or each column reduces a dependence on a compensation circuit in a driving circuit of the pixel structure.

2. The pixel structure according to claim 1, wherein the first sub-pixels and the second sub-pixels have a same shape.

3. The pixel structure according to claim 2, wherein two third sub-pixels are disposed on each side of the second regular quadrilateral.

4. The pixel structure according to claim 2, wherein each of the third sub-pixel comprises rectangular.

5. The pixel structure according to claim 2, wherein an area of each of the third sub-pixels is less than an area of each of the first sub-pixels.

6. The pixel structure according to claim 2, wherein the first sub-pixels, the second sub-pixels, and the third sub-pixels are red sub-pixels, green sub-pixels, and blue sub-pixels, respectively.

7. The pixel structure according to claim 2, wherein a ratio of a number of one whole first sub-pixel, the second sub-pixels, and the third sub-pixels in each of the honeycomb units is 1:1:8, and a combination of first sub-pixel portions is equal to the one whole first sub-pixel to make for the 1:1:8 ratio.

8. The pixel structure according to claim 1, wherein the first sub-pixels and the second sub-pixels are octagonal or circular.

9. The pixel structure according to claim 1,
wherein a threshold voltage of a driving thin film transistor included in each of the second sub-pixels of each row or each column and a data signal voltage thereof are same; and
wherein a threshold voltage of a driving thin film transistor included in each of the third sub-pixels of each row or each column and a data signal voltage thereof are same.

10. A display device, comprising:
a pixel structure comprising:
honeycomb units configured to divide the pixel structure into a plurality of regions, each of the honeycomb units comprising a first regular quadrilateral; each of the honeycomb units comprising:
a first sub-pixel disposed at a vertex of the first regular quadrilateral;
a second sub-pixel disposed at a center of the first regular quadrilateral; and
a third sub-pixel disposed on a side of a second regular quadrilateral, wherein a vertex of the second regular quadrilateral is positioned at a midpoint of each side of the first regular quadrilateral;
wherein rows and columns where the first sub-pixels are located are all the first sub-pixels;
wherein rows and columns where the second sub-pixels are located are all the second sub-pixels; and
wherein rows and columns where the third sub-pixels are located are all the third sub-pixels;
wherein a threshold voltage of a driving thin film transistor included in each of the first sub-pixels of each row or each column and a data signal voltage thereof are same, a configuration of the same threshold voltage and data signal voltage of the driving thin film transistor included in each of the first sub-pixels of each row or each column reduces a dependence on a compensation circuit in a driving circuit of the pixel structure.

11. The display device according to claim 10, wherein the first sub-pixels and the second sub-pixels have a same shape.

12. The display device according to claim 11, wherein two third sub-pixels are disposed on each side of the second regular quadrilateral.

13. The display device according to claim 11, wherein each of the third sub-pixel comprises rectangular.

14. The display device according to claim 11, wherein an area of each of the third sub-pixels is less than an area of each of the first sub-pixels.

15. The display device according to claim 11, wherein the first sub-pixels, the second sub-pixels, and the third sub-pixels are red sub-pixels, green sub-pixels, and blue sub-pixels, respectively.

16. The display device according to claim 11, wherein a ratio of a number of one whole first sub-pixel, the second sub-pixels, and the third sub-pixels in each of the honeycomb units is 1:1:8, and a combination of first sub-pixel portions is equal to the one whole first sub-pixel to make for the 1:1:8 ratio.

17. The display device according to claim 10, wherein the first sub-pixels and the second sub-pixels are octagonal or circular.

18. The display device according to claim 10,
wherein a threshold voltage of a driving thin film transistor included in each of the second sub-pixels of each row or each column and a data signal voltage thereof are same; and
wherein a threshold voltage of a driving thin film transistor included in each of the third sub-pixels of each row or each column and a data signal voltage thereof are same.

* * * * *